(12) United States Patent
Nammi et al.

(10) Patent No.: US 10,270,559 B2
(45) Date of Patent: Apr. 23, 2019

(54) SINGLE ENCODER AND DECODER FOR FORWARD ERROR CORRECTION CODING

(71) Applicant: AT&T INTELLECTUAL PROPERTY I, L.P., Atlanta, GA (US)

(72) Inventors: SaiRamesh Nammi, Austin, TX (US); Xiaoyi Wang, Austin, TX (US); Arunabha Ghosh, Austin, TX (US)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 43 days.

(21) Appl. No.: 15/377,943

(22) Filed: Dec. 13, 2016

(65) Prior Publication Data

US 2018/0097583 A1 Apr. 5, 2018

Related U.S. Application Data

(63) Continuation-in-part of application No. 15/285,453, filed on Oct. 4, 2016.
(Continued)

(51) Int. Cl.
*H04L 1/00* (2006.01)
*H04L 29/06* (2006.01)
(Continued)

(52) U.S. Cl.
CPC ........ *H04L 1/0072* (2013.01); *H03M 13/353* (2013.01); *H04L 1/0009* (2013.01);
(Continued)

(58) Field of Classification Search
CPC ..... H04L 1/0072; H04L 69/22; H04L 1/0009; H04L 1/0041; H04W 88/02;
(Continued)

(56) References Cited

U.S. PATENT DOCUMENTS 6,208,626 B1 3/2001 Brewer
7,346,832 B2 3/2008 Richardson et al.
(Continued)

FOREIGN PATENT DOCUMENTS

CA 2053851 C 9/1997
EP 0863682 A1 9/1989
(Continued)

OTHER PUBLICATIONS

International Search Report and Written Opinion dated Dec. 15, 2017 for PCT Application No. PCT/US2017/052577, 15 pages.
(Continued)

*Primary Examiner* — Faisal Choudhury
(74) *Attorney, Agent, or Firm* — Amin, Turocy & Watson, LLP

(57) ABSTRACT

Various embodiments disclosed herein provide for a transmitter that can adjust the size of an information block or segment the information block based on a forward error correction (FEC) code optimum efficiency. Certain FEC codes are more efficient at encoding and decoding longer information blocks and if an information block is shorter than a predetermined length, the transmitter can pad the information block with a group of null bits to lengthen the information block to increase the performance of encoding and decoding the information block. In some embodiments, the transmitter can segment the information block into a set of segments, and if the last segment is below the predetermined length, the transmitter can pad the last segment.

20 Claims, 10 Drawing Sheets

Related U.S. Application Data

(60) Provisional application No. 62/421,188, filed on Nov. 11, 2016.

(51) Int. Cl.
*H03M 13/35* (2006.01)
*H04W 88/02* (2009.01)
*H03M 13/11* (2006.01)
*H03M 13/13* (2006.01)
*H03M 13/29* (2006.01)

(52) U.S. Cl.
CPC ............ *H04L 1/0041* (2013.01); *H04L 69/22* (2013.01); *H03M 13/1102* (2013.01); *H03M 13/13* (2013.01); *H03M 13/136* (2013.01); *H03M 13/2957* (2013.01); *H04W 88/02* (2013.01)

(58) Field of Classification Search
CPC ........... H03M 13/353; H03M 13/1102; H03M 13/13; H03M 13/136; H03M 13/2957
USPC .......................................................... 370/329
See application file for complete search history.

(56) References Cited

U.S. PATENT DOCUMENTS

| | | |
|---|---|---|
| 7,389,464 B2 | 6/2008 | Jeong et al. |
| 7,664,008 B2 | 2/2010 | Stolpman et al. |
| 7,747,929 B2 | 6/2010 | Kyung et al. |
| 7,783,316 B1 | 8/2010 | Mitchell |
| 7,802,164 B2 | 9/2010 | Hong et al. |
| 7,987,410 B2 | 7/2011 | Hedberg et al. |
| 8,429,503 B2 | 4/2013 | Okamura et al. |
| 8,656,247 B2 | 2/2014 | Kyung et al. |
| 8,667,360 B2 | 3/2014 | Motwani |
| 8,826,102 B2 | 9/2014 | Liu et al. |
| 9,118,353 B2 | 8/2015 | Eroz et al. |
| 9,369,883 B2 | 6/2016 | Giffin et al. |
| 2006/0059401 A1 | 3/2006 | Ko |
| 2006/0218459 A1 | 9/2006 | Hedberg |
| 2007/0014331 A1 | 1/2007 | Eldon et al. |
| 2008/0091986 A1* | 4/2008 | Nimbalker ........... H03M 13/275 714/701 |
| 2010/0031125 A1* | 2/2010 | Shen ................ H03M 13/2739 714/781 |
| 2010/0070822 A1* | 3/2010 | Leung .................... H04L 1/007 714/752 |
| 2010/0251069 A1 | 9/2010 | Sun et al. |
| 2010/0329308 A1 | 12/2010 | Kim et al. |
| 2011/0026623 A1* | 2/2011 | Srinivasa ............. H04L 1/0016 375/260 |
| 2012/0216099 A1* | 8/2012 | Jeong ................ H03M 13/1102 714/800 |
| 2012/0252462 A1 | 10/2012 | Fahldieck |
| 2013/0097474 A1 | 4/2013 | Hwang et al. |
| 2014/0195873 A1 | 7/2014 | Ishida et al. |
| 2015/0003277 A1 | 1/2015 | Wellington |
| 2015/0117269 A1 | 4/2015 | Navalekar et al. |
| 2016/0099796 A1 | 4/2016 | Yang et al. |
| 2016/0233980 A1* | 8/2016 | Pantelias ............... H04L 1/0041 |
| 2016/0315733 A1 | 10/2016 | Murakami et al. |
| 2017/0295607 A1 | 10/2017 | Prasad |

FOREIGN PATENT DOCUMENTS

| | | |
|---|---|---|
| EP | 0794631 A2 | 9/1997 |
| EP | 1189379 A1 | 3/2002 |
| EP | 1593226 A1 | 11/2005 |
| WO | 2004107185 A1 | 12/2004 |
| WO | 2009102190 A2 | 8/2009 |
| WO | 2016045391 A1 | 3/2016 |
| WO | 2016095964 A1 | 6/2016 |
| WO | 2016140292 A1 | 9/2016 |
| WO | 2017014846 A1 | 1/2017 |

OTHER PUBLICATIONS

Office Action dated Mar. 5, 2018 for U.S. Appl. No. 15/285,453, 36 pages.
Jaber et al. "5G Backhaul Challenges and Emerging Research Directions: A Survey." IEEE Access 4 (2016): 1743-1766. [http://ieeexplore.ieee.org/stamp/stamp.jsp?arnumber=7456186]. Retrieved on Sep. 15, 2016, 24 pages.
Lodro et al., "Device-To-Device Communication in LTE-A and Its Prospects for 5G Cellular Communication." (2015). [https://www.researchgate.net/profile/Mir_Lodro/publication/272293566_Device-To-Device_Communication_in_LTEA_and_its_Prospects_for_5G_Cellular_Communication/links/54e0fcec0cf24d184b0f861e.pdf]. Retrieved on Sep. 15, 2016, 26 pages.
Paul et al., "Implementation and analysis of forward error correction decoding for Cloud-RAN systems." 2015 IEEE International Conference on Communication Workshop (ICCW). IEEE, 2015. [https://pdfs.semanticscholar.org/5362/679d60c36f0d3af7f91607ac39254069d43b.pdf]. Retrieved on Sep. 15, 2016, 6 pages.
Gorgoglione et al., "Benefits and impact of cloud computing on 5G signal processing." (2014). [https://www.researchgate.net/profile/Dirk_Wuebben/publication/270506903_Benefits_and_Impact_of_Cloud_Computing_on_5G_Signal_Processing/links/54abe3bb0cf2bce6aa1dc60f.pdf]. Retrieved on Sep. 15, 2016, 10 pages.
Studer et al., "Simulator for LDPC decoding in IEEE 802.11n", Cornell Univ., csl.cornell.edu, Jan. 3, 2015, retrieved via Internet Archive Wayback Machine [http://web.archive.org/web/20150103082603/http://www.csl.cornell.edu/~studer/software_ldpc.html]. Retrieved on Nov. 29, 2016, 2 pages.
Final Office Action dated Jul. 6, 2018 for U.S. Appl. No. 15/285,453, 24 pages.
Notice of Allowance received for U.S. Appl. No. 15/285,453 dated Nov. 2, 2018, 24 pages.

* cited by examiner

SINGLE ENCODER AND DECODER FOR FORWARD ERROR CORRECTION CODING

RELATED APPLICATION

The subject patent application claims priority to U.S. Provisional Patent Application No. 62/421,188, filed Nov. 11, 2016, and entitled, "SINGLE ENCODER AND DECODER FOR FORWARD ERROR CORRECTION CODING." This application is also a continuation in part of and claims priority to U.S. patent application Ser. No. 15/285,453, filed Oct. 4, 2016, and entitled, "FORWARD ERROR CORRECTION CODE SELECTION IN WIRELESS SYSTEMS". The entireties of the foregoing patent applications are hereby incorporated by reference herein in their entireties.

TECHNICAL FIELD

The disclosed subject matter relates to selection of a forward error correction code in a wireless system. More specifically, this disclosure relates to selection of a forward error correction code in a wireless system based on a wireless system parameter to enable improvement of wireless system performance over conventional wireless system technologies, e.g., for fifth generation (5G) technologies or other next generation networks.

BACKGROUND

To meet the huge demand for data centric applications, third generation partnership project (3GPP) systems and systems that employ one or more aspects of the specifications of fourth generation (4G) standards for wireless communications will be extended to fifth generation (5G) standards for wireless communications. Unique challenges exist to provide levels of service associated with forthcoming 5G and/or other next generation standards for wireless networks.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
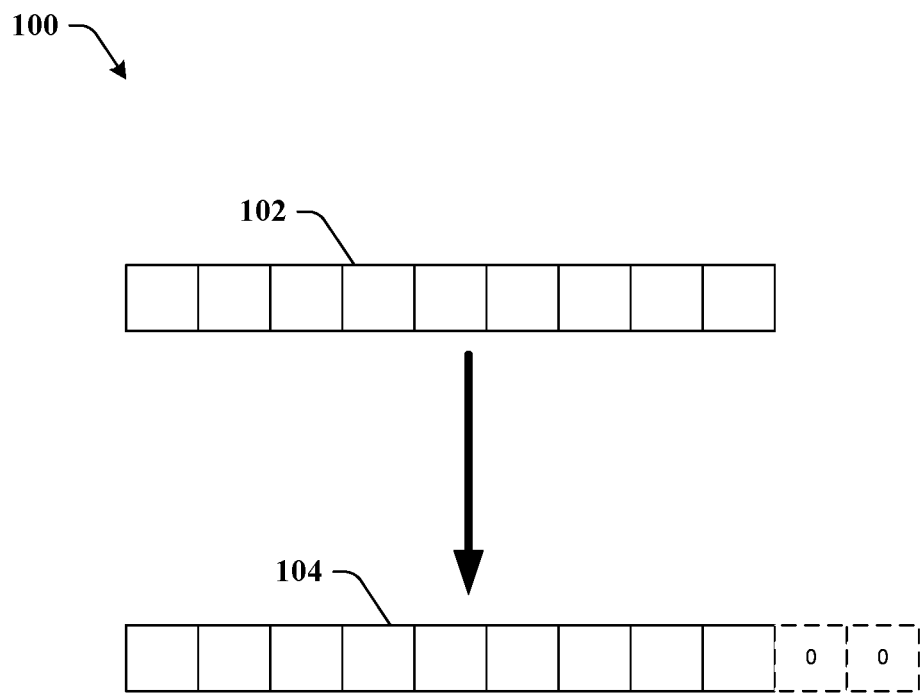
FIG. 1 illustrates an example schematic diagram of a padded information block in accordance with various aspects and embodiments of the subject disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

In an embodiment, a transmitter can comprise a processor and a memory that stores executable instructions that, when executed by the processor, facilitate performance of operations, including receiving an information block that comprises a first number of bits. The operations can also include determining that the information block is less than a second number of bits, wherein the second number of bits is associated with a forward error correction code. The operations can also include padding the information block with a group of bits resulting in a padded information block, wherein a number of bits in the group of bits is a difference between the second number and the first number. The operations can also include transmitting the padded information block.

In another embodiment, a method can include receiving, by a device comprising a processor, an information block and segmenting the information block into a first segment and a second segment, wherein the first segment comprises a first number of bits and the second segment comprises a second number of bits, wherein the first number of bits is above a predetermined bit number associated with an efficiency of a forward error correction code, and the second number of bits is below the predetermined bit number. The method can also include adding a group of bits to the second segment resulting in an augmented segment, wherein a third number of bits in the augmented segment is at least equal to the predetermined bit number.

In another embodiment, a system can comprise a processor and a memory that stores executable instructions that, when executed by the processor, facilitate performance of operations. The operations can include receiving an information block that is larger than a predetermined size, wherein the predetermined size is associated with an efficiency value determined for a forward error correction code. The operations can also include segmenting the information block into at least a first segment and a second segment, wherein the first segment and the second segment are smaller than the predetermined size. The operations can also include encoding the first segment and the second segment based on the forward error correction code resulting in an encoded first segment and an encoded second segment.

An increasingly crowded RF spectrum and demand for an ever faster and more efficient communications network is pushing for improvements in wireless systems, e.g., wireless network carrier systems, etc. Conventional wireless systems generally designate a fixed forward error correction (FEC) code scheme for communication of data between mobile devices (UEs) and radio access network (RAN) devices of the wireless system. A variety of FEC codes are well known and wireless carriers have adopted different FEC codes for use in their wireless systems based on various business goals, however, these conventional wireless systems typically rely on an adopted FEC code in large portions of the coverage areas provided by their wireless systems. Typically, a wireless system does not employ a plurality of FEC codes concurrently between different user equipments accessing a RAN device, or changing a FEC code for a single UE as conditions of the communication channel change. Rather, in many conventional wireless systems, a specific FEC code is adopted for communication between a UE and a RAN device and that FEC code is adhered to despite changes in the characteristics of the wireless network or changes in the communication channel.

An FEC code generally enables a UE to determine when transmitted data is accurate, especially when data transmission occurs over unreliable or noisy communications links that can degrade transmitted data. Under typical FEC code schemes, some redundant data is transmitted with error-correcting code that facilitates detection, and often correction, of flawed data by the receiving user equipment. This can occur without needing to request a retransmission and, therefore, can allow error correction without use of a reverse channel between the user equipment and the data source transmitter. FEC code types can include, but are not limited to low density parity check (LDPC), turbo codes, polar codes, Hadamard codes, Reed-Muller codes, long code, etc. The disclosed subject matter can generally facilitate selection and use of nearly any FEC code and is expressly not limited to the particular FEC codes named herein.

It is generally accepted that a wireless system characteristic can dictate which FEC codes will work most effectively for a given value of that characteristic. As an example, a distance between devices, noise or interference on a communication channel, geography or topography in a wireless network service area, etc., can each influence the performance of a FEC coding scheme applied by the wireless system operator. In some circumstances, a single adopted FEC code in a conventional wireless system can experience performance changes as the characteristics of the wireless system, communication channel, etc., change. As a result, communication efficiency in a conventional wireless system can be affected. As an example, where a UE is proximate to an eNodeB device, a LDPC code can perform better than other FEC codes, however, as the UE moves away from the eNodeB, the LDPC code can perform more poorly than other FEC codes. This performance differential can reduce wireless network efficiency where only an LDPC code is employed by the wireless system. As another example, where an eNodeB is supporting two UEs, one UE close and the other UE far from the eNodeB, the use of only an LDPC code can result in good performance for the near UE and poor performance for the far UE. Moreover, conventional adoption of a single FEC code can affect support for UEs that do not support the adopted FEC code. This can result in conventional wireless systems employing a 'lowest common denominator' FEC code, e.g., an FEC code that is most broadly useable by UE chipsets, that gives acceptable performance over the greatest amount of coverage area, etc., even where the adoption of that particular FEC code results in lesser performance for some communication channels or for some UEs. It is generally desirable to allow for use of a plurality of FEC code schemes to improve the performance of the wireless system by allowing different FEC codes to be used concurrently for different UEs, e.g., contemporaneously, simultaneously, the use of the different FEC codes has at least some overlap in time among the different UEs, etc., to facilitate dynamic reselection of to a different FEC code in response to changes in a communication channel, to support different UEs that can support different FEC code schemes, etc.

In a typical provisioning of a communication channel between a UE and an eNodeB, a pilot or reference signal, which can be beamformed or non-beamformed, can be received by a UE. The UE can then determine a channel estimate and parameter(s) for reporting channel state information (CSI). The CSI report can, for example, comprise channel quality indicator information (CQI), precoding matrix index information (PMI), rank information (RI), sub-band index data, beam index data, etc. A CSI report can be sent to an eNodeB, for example, via a feedback channel. The UE can be scheduled to the eNodeB based on CSI information, e.g., from the CSI report. An eNodeB can send a scheduling parameter to a UE in a downlink control channel to facilitate further transfer of data between the eNodeB and the UE. Generally, CQI is tabularized in a CSI report to facilitate reporting of a CQI index to the UE. As an example, a CQI table comprising CQI indices can be:

| CQI index | modulation | code rate x 1024 | efficiency |
|---|---|---|---|
| 0 | | out of range | |
| 1 | QPSK | 78 | 0.1523 |
| 2 | QPSK | 120 | 0.2344 |
| 3 | QPSK | 193 | 0.3770 |
| 4 | QPSK | 308 | 0.6016 |
| 5 | QPSK | 449 | 0.8770 |
| 6 | QPSK | 602 | 1.1758 |
| 7 | 16QAM | 378 | 1.4766 |
| 8 | 16QAM | 490 | 1.9141 |
| 9 | 16QAM | 616 | 2.4063 |
| 10 | 64QAM | 466 | 2.7305 |
| 11 | 64QAM | 567 | 3.3223 |
| 12 | 64QAM | 666 | 3.9023 |
| 13 | 64QAM | 772 | 4.5234 |
| 14 | 64QAM | 873 | 5.1152 |
| 15 | 64QAM | 948 | 5.5547 |

Where the CQI can be updated, based on characteristics of the wireless system or communication channel, scheduling of the UE via the eNodeB can allow for selection of different FEC codes among different UEs in the service are of the eNodeB, reselection of FEC codes for a UE based on changes in a channel condition, use of FEC codes related to the limitations of different UEs, etc. In an aspect, configuring the FEC code, and the corresponding CQI table, can be performed for downlink transmission and/or uplink transmission. In another aspect, the CQI table/data can comprise different code rate granularities in accordance with the corresponding FEC code. As an example, a turbo code FEC coding CQI table/data can comprise CQI indices that favor higher data rates, e.g., more higher data rate turbo code indices than lower data rate turbo code indices, in comparison to a LDPC FEC coding CQI table/data that can favor lower data rates, e.g., fewer higher data rate LDPC indices than lower data rate LDPC indices.

While in some embodiments, each FEC code can have a corresponding CQI table/data, in some embodiments, a single CQI table/data can represent multiple FEC codes in a single CQI table/data. As such, where embodiments have a 1-to-1 FEC code-to-CQI table/data relationship, when an FEC code for a communication channel is adapted, a different CQI table/data can be employed for coding data transmitted on the communication channel. However, in some embodiments where the CQI table/data embodies a plurality of FEC codes, a the selection of FEC codes represented in the single CQI table/data can facilitate a UE switching between different FEC coding by selecting different CQI table index from the single CQI table/data. As an example, a CQI table according to these embodiments can have both turbo code and LDPC entries in the same table/data. Moreover, the CQI table/data can comprise multiple turbo code FEC code rates and/or multiple LDPC FEC code rates in the same CQI table/data. Accordingly, a UE can then select, for example, a LDPC FEC code rate that can be the same as a turbo code FEC code rate but where the LDPC FEC code rate is desirable over the turbo code FEC code rate for another reason, such as robustness. In an aspect, the disclosed subject matter can have embodiments that combine these aspects, such that some FEC codes can have a separate CQI table/data while other FEC codes are represented in a combined CQI table/data. As an example, Polar FEC code can have a separate CQI table and another CQI table/data can comprise both LDPC and turbo code FEC code entries. As an extension of these embodiments, some CQI table/data overlap can occur in some embodiments, for example, there can be a first turbo code FEC CQI table/data and a second CQI table/data that comprises LDPC entries and turbo code entries in the second CQI table/data and wherein selection of turbo code FEC code can employ either the first CQI table/data or the second CQI table/data.

Wherein the performance of different FEC code schemes can be dissimilar for different code rates and/or for different modulation schemes, an eNodeB can flexibly schedule FEC codes for a UE to enable the UE to decode a data received by a downlink channel and encode data for uplink data channels according to a selected FEC code, rather than merely adopting a single FEC code for all the code rates and modulation schemes. In an embodiment, link throughput can be enhanced by using a FEC technique selected for given wireless system or communication channel conditions. For example, where Turbo and LDPC are available FEC codes and are defined in corresponding CQI tables, an example Turbo CQI table can define more entries at low code rates and/or low modulation schemes to account for turbo code performing better at low code rates or lower modulation. Similarly, an example LDPC CQI table can define more entries for higher modulation and/or higher code rates. Moreover, where another FEC code is available, a further CQI table can be defined accordingly.

In an embodiment, different FEC codes can have different efficiencies and performances when being applied to different block lengths. Polar, Turbo and LDPC1 (low density parity check) codes perform better at low block lengths, while LDPC2 codes perform better at larger block lengths. To enable transmitters and receivers to have a single coder and decoder, rather than using different coding schemes, the size of the information block can be adjusted to maximize the performance for a given forward error correction code. Hence, given a number X, where Polar/Turbo/LDPC1 codes are better used for information blocks lower than X, and LDPC2 codes are used for information blocks larger than X, information blocks of Y length can be adjusted so that they are above or below X. In this way, the transmitter and receiver can use a single FEC technique.

During the course of communication with a user equipment (UE), the information blocks may change length depending on the quality of communications, signal strength, interference, distance from a transmitter, etc. Since different FEC codes or more or less efficient at various information block lengths, to maximize performance, different FEC coding techniques are traditionally applied. These require different hardware and software components however, and make transmitters and receivers more expensive and slower, due to the selection between FEC coding techniques. Therefore, by adjusting the length of the information blocks, by either segmenting the blocks to get shorter information block segments appropriate for some FEC techniques (Polar, Turbo, LDPC1), or by padding the information blocks to use FEC codes (e.g., LDPC2) codes appropriate for longer blocks, a single FEC encoder can be used.

In an embodiment, if an information block length is Y and the block length is less than X, where X is a number that the forward error correction code does not perform as well below (e.g., LDPC2). The information block can be padded with zeroes or null bits to fill the size of the information block length to match X. In other embodiments, the padded bits can include non-null bits. Once the padding is completed, the LDPC2 coder encodes the data and transmits the data. The receiver can decode blindly assuming the padded bits are part of the information block and pass the decoded data to the upper layer for interpretation. The upper layer (e.g., transport layer) extracts the exact information block it knows the size of the padded bits. In other embodiments, the receiver can receive a control signal from the transmitter that indicates the number of padded bits.

In another embodiment, the information block length can be Y. In general, Y is segmented for ease of processing to fixed block lengths say Y1, Y2 and Y3 etc. where Y1 and Y2 are of equal in size and Y1+Y2+Y3=Y. In this case, Y is greater than X, and that Y1 and Y2 are greater than X, but Y3 may be less than X in some embodiments, depending on the original size of the information block, and size of Y1 and Y2. Y1 and Y2 can be encoded using the FEC code, while Y3 can be padded as in the example above until it is at least as large as X. Hence LDPC2 can be used for all the segments. Hence the rule is the last segment of data block is padded with zeros for encoding using only one FEC code for all the segments.

In another embodiment, instead of dividing the data using fixed segmentation size, we can vary the segmentation size such that the last segment is padded with less zeros for encoding all segments using single FEC code. In this case we need to indicate the segmentation size to the receiver before data transmission by sending a control signal or other indicator indicating the size of the segments. For example in the control/grant channel the network can indicate the segmentation size.

By way of example, say X=1000, and Y=9100, then the transmitter can choose segmentation size S such that padded bits to the last segment will be minimized. In this case say the S is equal to 4500, then Y1=4500, Y2=4500, y3=100. In this case we need to pad 900 zeros so that the transmitter and receiver can use one FEC. However with segmentation size S equal to 4550, we can completely eliminate the padding, but still use only one FEC code. In one embodiment, the network can choose S from a set of pre-defined sizes so that amount of padding is minimized in the last segment yet using only one FEC code.

In another embodiment, instead of using LDPC2 coding, Polar/Turbo/LDPC1 coding can be used. Instead of dividing the information blocks into multiple segments above X, and then padding the last segment to equal or exceed X, the information block can be split into segments below the size of X.

Turning now to FIG. 1, illustrated is an example schematic diagram 100 of a padded information block in accordance with various aspects and embodiments of the subject disclosure.

In an embodiment, information block 102 can have 9 bits. In the embodiment, the forward error correction code being used (e.g., LDPC2) may work best when the length of the information block is 11 bits. Therefore, the system can pad the information block with two extra zeros or null bits resulting in a padded information block 104. In this way, the LDPC2 can be used at high efficiency, even for information blocks that may initially have been too small. The system can send an indication to the receiver via a control signal indicating the number of padded bits.

It is to be appreciated that the number of bits described in FIG. 1 are merely exemplary and that the number of bits in other embodiments, may vary. For instance, in an embodiment, the information block can ideally be at least 1024 bits. When the signal to noise ratio is high, or when interference is low, such as when the UE is near a base station, the information block size can be larger than 1024, and so nothing will need to be done to information block 102. However, when the UE is further from the base station, the information blocks may be shorter, in order to increase the overall bandwidth due to avoiding bad or corrupted packets or bits when transmitting. These information blocks may be smaller than 1024 bits, for example, the information blocks may be 900 bits or any other size. In that case, the transmitter would see pad the information block 102 with a group of null bits such that the length of the augmented information block or information block segment was at least 1024 bits (e.g., padded with 124 null bits).

In an embodiment, a transmitter device (e.g., an eNodeB, gNodeb, macrocell, basestation, etc.) can receive an information block 102 that is to be sent to a UE. The transmitter device can determine which FEC code is to be used to encode the information block (e.g., based on the UE device, standard protocol, etc) and determine whether the information block 102 is at least as long as the predetermined length associated with the FEC code. If the FEC code is LDPC2, and is more efficient with larger information blocks, the transmitter device can add zeros or null bits to the information block 102 until the length is at least as long as the predetermined length. In the embodiment shown in FIG. 1, the predetermined length is 11, and the information block is only 9 bits long. Therefore, in the case of LDPC2 code being used, the transmitter can add 2 bits to the information block 102 resulting in padded or augmented information block 104.

Figure 2:
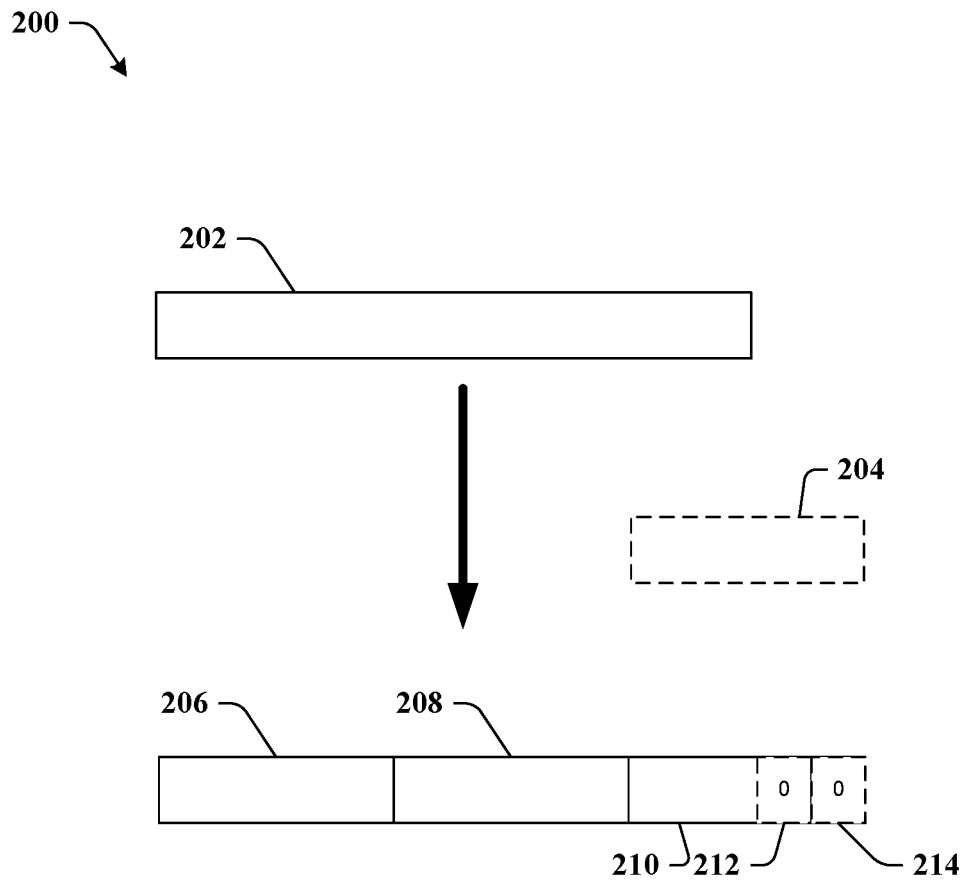
FIG. 2 illustrates an example block diagram of a segmented information block in accordance with various aspects and embodiments of the subject disclosure.

Turning now to FIG. 2, illustrated is an example block diagram 200 of a segmented information block in accordance with various aspects and embodiments of the subject disclosure.

Information block 202 can have a length that is Y. In general, Y can be segmented for ease of processing to fixed block lengths say Y1 206, Y2 208 and Y3 210 etc. where segments 206 and 208 can be an equal size that is equal to or larger than the size of the minimum size block 205 for the forward error correction code. Since block 210 can originally be smaller than block 204, segment 210 can be padded with zeros 212 and 214 to make segment 210 at least the size of block 204. In this way each of blocks 206, 208, and 210 can be encoded using the forward error correction code (e.g., LDPC2).

In an embodiment, an optimum information block length for a transmitter to FEC encode information blocks may be a length equal or similar to the length of the segment 204. When information blocks get longer, such as when the signal to noise ratio is good, interference is low, the UE is near the base station device, etc., the information block can be longer, such as information block 202 is several times larger than segment 204. Since FEC encoders and decoders can work more efficiently, being faster and having lower latency when the length of the information blocks is closer to length 204, information block 202 can be segmented such that the segment lengths are closer to the size of information bock segment 204. The base station device or UE transmitting the information block 202 can determine how long 204 is, and how many segments the information block 202 will be segmented into, and then segment the information block 202 into the requisite number of segments.

For instance, as shown in FIG. 2, information block 202 can be segmented into roughly three segments that are similar in size to information block segment 204. Information blocks segments 206 and 208 are equal or very similar in size to block 204, while segment 210, can be a little shorter. In order to optimize the FEC encoding, information block segment 210 can be padded with two null bits, 212 and 214 so that the segment is as long as segment 204 which can be a more optimum length for the selected FEC encoder. In an embodiment, the transmitter can select the size of the segments 206, 208, and 210 to minimize the amount of padding that will need to be performed.

Figure 3:
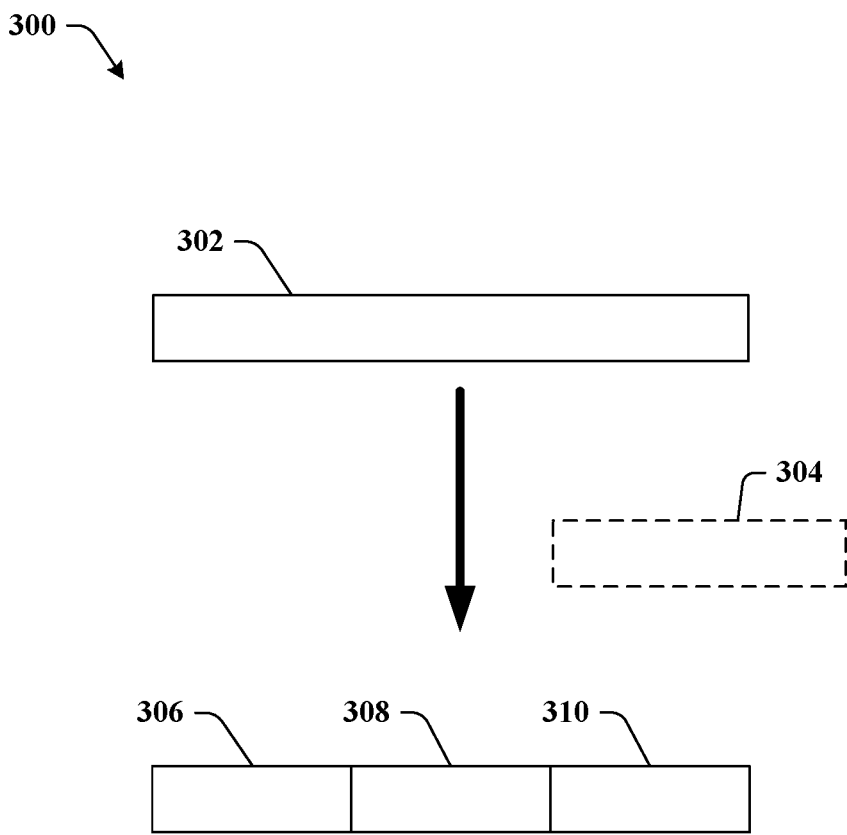
FIG. 3 illustrates an example block diagram of a segmented information block in accordance with various aspects and embodiments of the subject disclosure.

Turning now to FIG. 3, illustrated is an example block diagram 300 of a segmented information block in accordance with various aspects and embodiments of the subject disclosure.

In an embodiment, an optimum information block length for a transmitter to FEC encode information blocks may be a length equal or smaller than the length of the segment 304 (e.g., such as FEC coding techniques, Polar, Turbo, and LDPC1). When information blocks get longer, such as when the signal to noise ratio is good, interference is low, the UE is near the base station device, etc., the information block can be longer, such as information block 302 is several times larger than segment 304. Since FEC encoders and decoders can work more efficiently, being faster and having lower latency when the length of the information blocks is at most the length of information block 304, information block 302 can be segmented such that the segment lengths are smaller than information bock segment 304. The base station device or UE transmitting the information block 302 can determine how long 304 is, and how many segments the information block 302 will be segmented into, and then segment the information block 302 into the requisite number of segments.

For instance, as shown in FIG. 2, information block 302 can be segmented into roughly three segments that are similar in size but smaller than information block segment 304. Information blocks segments 306, 308, and 310 can be equal or very similar in size to block 304.

Figure 4:
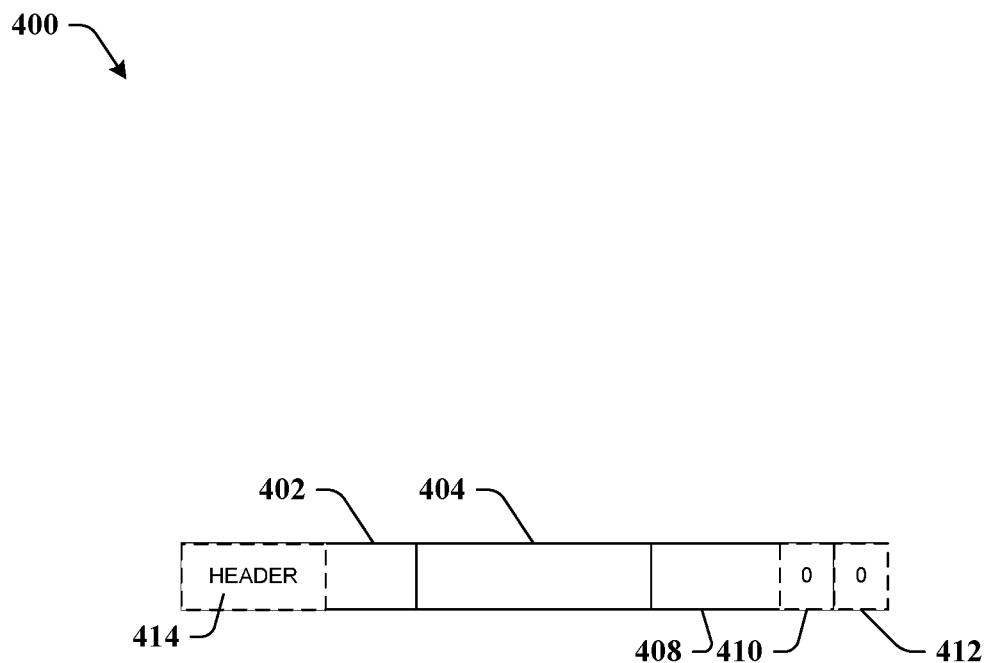
FIG. 4 illustrates an example block diagram of a segmented information block with a header in accordance with various aspects and embodiments of the subject disclosure.

Turning now to FIG. 4, illustrated is an example block diagram 400 of a segmented information block with a header in accordance with various aspects and embodiments of the subject disclosure.

In an embodiment, the information block can be segmented into three segments, 402, 404, and 408. Similar to the embodiment, in FIG. 2, segment 408 can have a group of null bits 410 and 412 added to the segment 408 such that the segment meets the predetermined bit length associated with efficiency of the FEC encoder. The transmitter can encode a message authentication code (MAC) header 414 into the information block that indicates to the receiver how many null bits there are in the segments.

The receiver can blindly decode the encoded information segments regardless of how many null bits there are, but then when the MAC header is interpreted, and it indicates how many null bits there are, and in which segments, the upper layers (e.g., transport layer of the OSI model) can use that information to properly interpret the decoded information blocks and discard the augmented null bits as appropriate. In an embodiment, the MAC header 414 can be added to the first segment 402 as shown in FIG. 4, but in other embodiments, the MAC header 414 can be spread across the information block segments 402, 404, and 408, or can be added to each of them.

Figure 5:
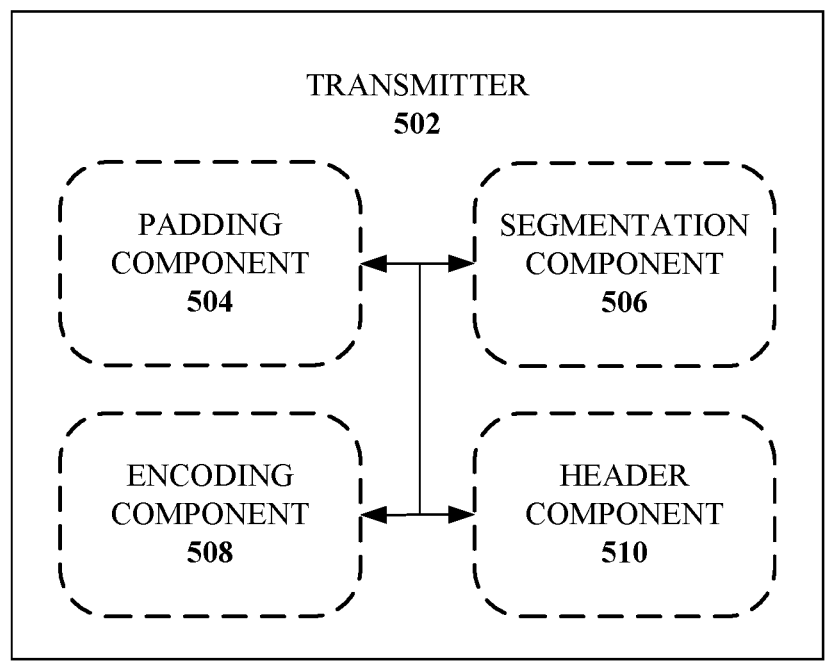
FIG. 5 illustrates an example block diagram of a transmitter that pads and segments information blocks in accordance with various aspects and embodiments of the subject disclosure.

Turning now to FIG. 5, illustrated is an example block diagram 500 of a transmitter 502 that pads and segments information blocks in accordance with various aspects and embodiments of the subject disclosure.

Transmitter device 502 can be a base station or macrocell such as an eNodeB, or gNodeB associated with 4G or 5G systems. The transmitter device 502 can also be a UE in some embodiments, such as a mobile device, or other end user device on a mobile network.

The transmitter device 502 can include a padding component 504 that receives an information block and determines that the information block is smaller than a predetermined size, wherein the predetermined size is associated with an efficiency of an FEC code that the encoding component 508 uses to encode the information blocks. The padding component 504 can be configured to augment the information block with a number of null bits, where the number of null bits added is equal in length to the size difference between the information block and the predetermined size.

In an embodiment, if the information block is larger than the predetermined size, a segmentation component 506 can segment the information block into a plurality of segments for ease of encoding, decoding, and transmission. The segmentation component 506 can also segment long information block into segments that are smaller than a predetermined length associated with efficiency of FEC codes such as Polar, Turbo, and LDPC1 codes.

In an embodiment when LDPC2 codes are used, the segmentation component 506 can segment the information block into segments that are at least as long as the predetermined efficiency size. If the last segment is smaller than the predetermined size, the segmentation component 506 can pass the last segment to the padding component 504 to pad the segment with one or more null bits to have it match the predetermined size.

In an embodiment, the segmentation component 506 can determine which size to segment the information block to based on which FEC code is being used, and based on the information block size. In other embodiments, the segmentation component 506 can also optimize the segmentation size in order to minimize the amount of padding needed when using LDPC2 codes.

In an embodiment, the header component 510 can add a header (e.g., a MAC header) to one or more of the segments or information blocks and the header can indicate which of the segments or information blocks is padded and how many null bits have been added. This information can be passed to the transport layer after decoding the information blocks and segments in order to discard the added null bits.

The encoder component 508 can encode the information blocks and information block segments using the FEC code that was considered by the padding and segmentation components 504 and 506.

Figure 6:
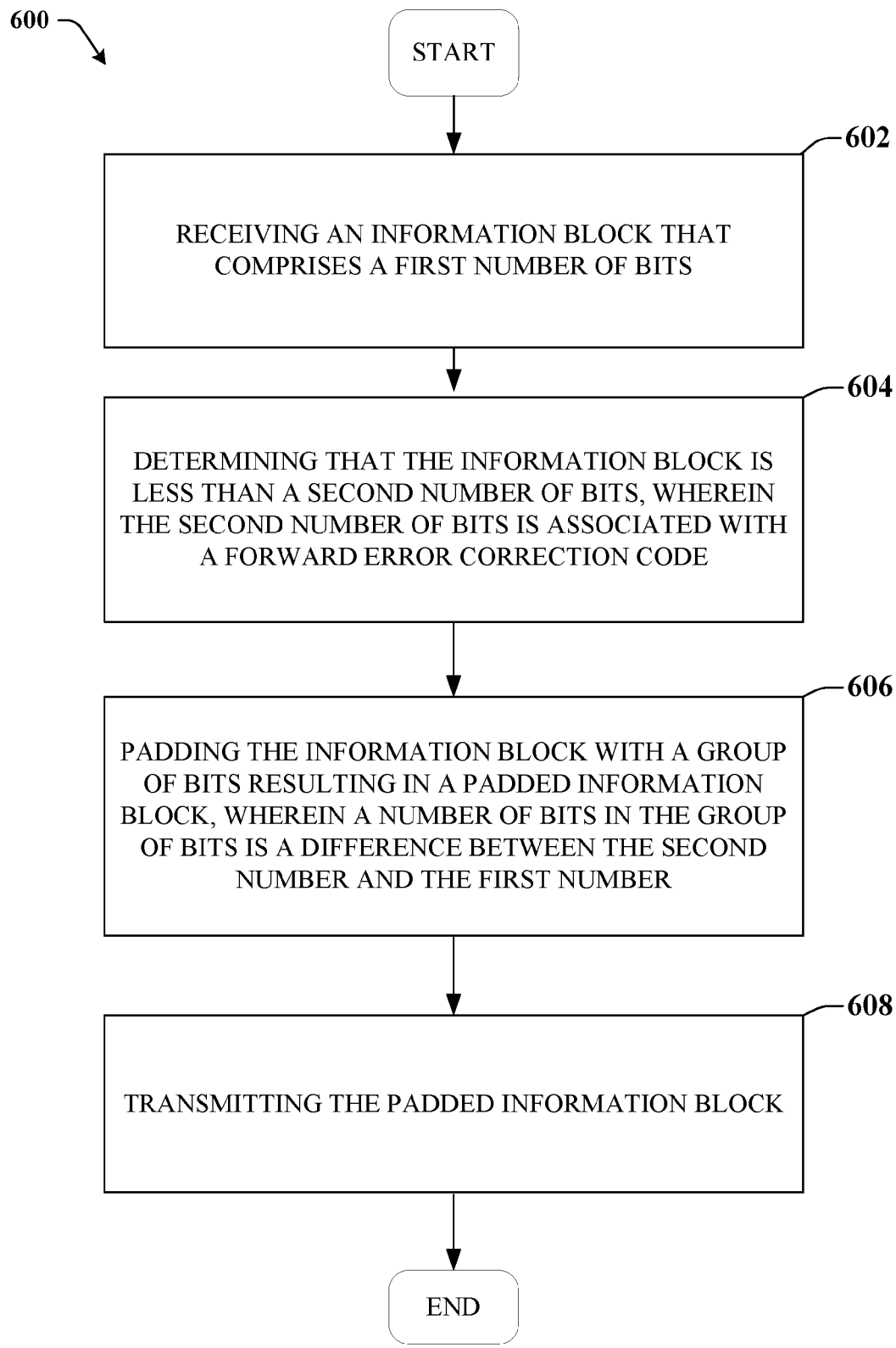
FIG. 6 illustrates an example method for adjusting the size of an information block in accordance with various aspects and embodiments of the subject disclosure.
Figure 7:
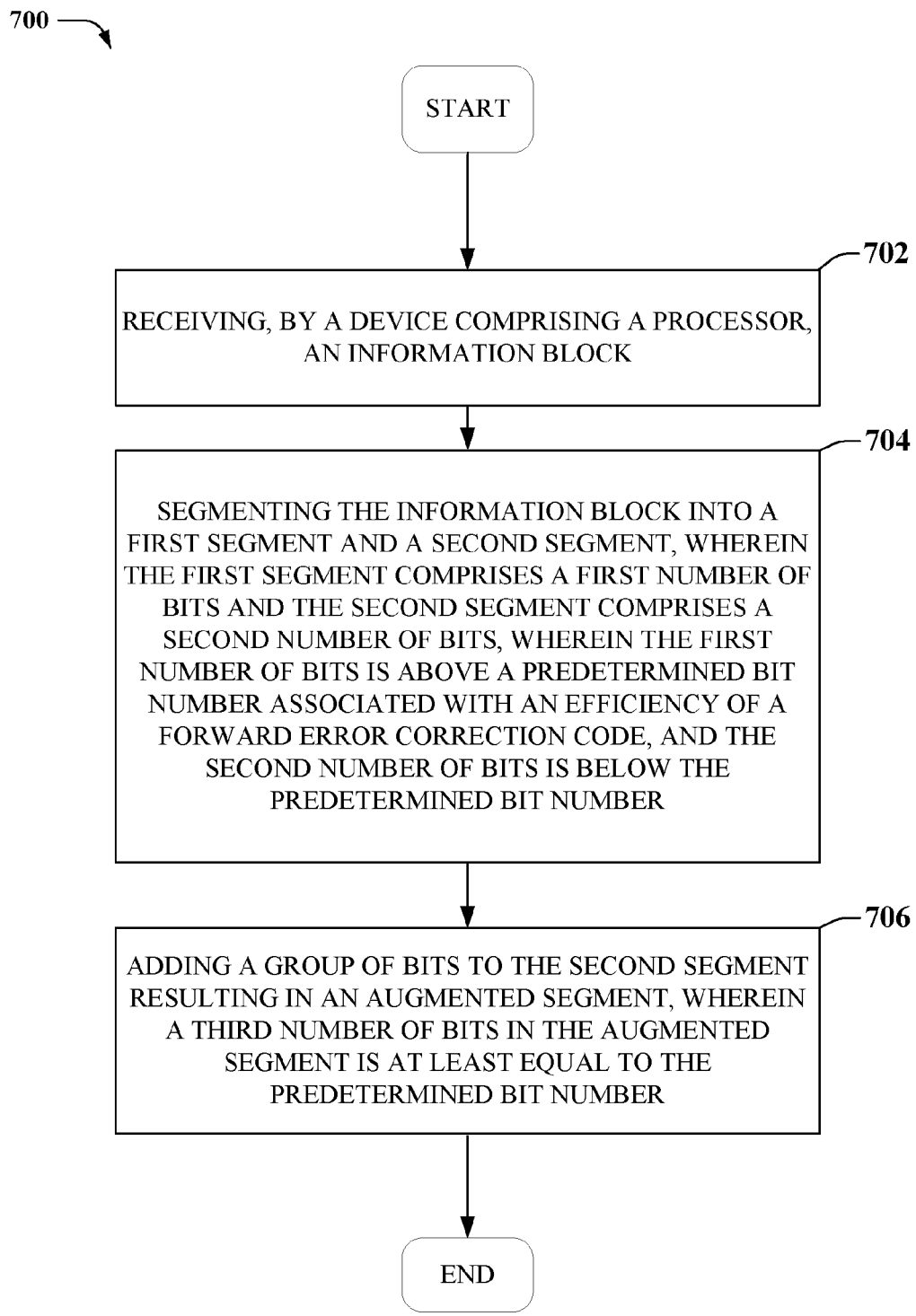
FIG. 7 illustrates an example method for segmenting and padding an information block in accordance with various aspects and embodiments of the subject disclosure.
Figure 8:
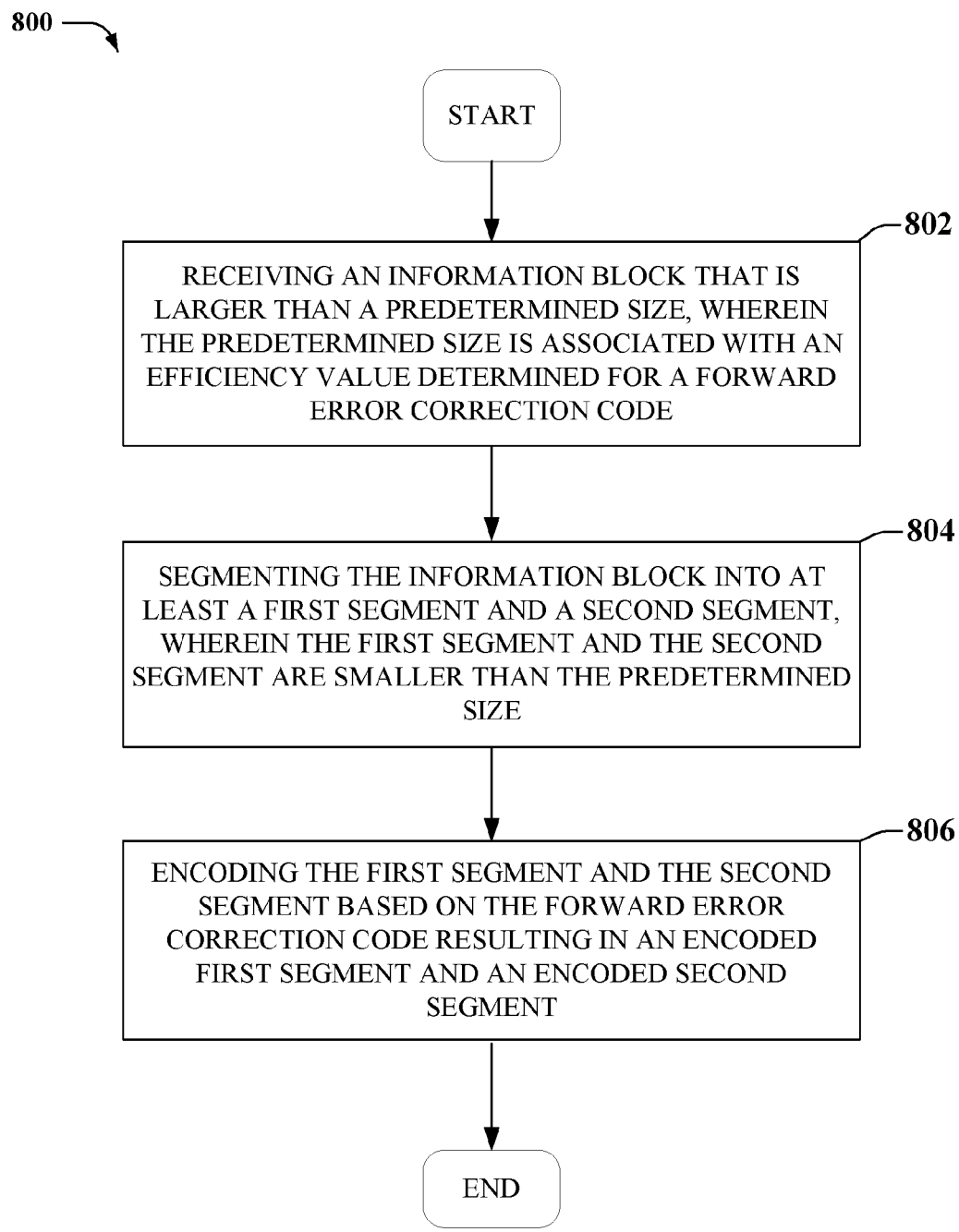
FIG. 8 illustrates an example method for segmenting an information block in accordance with various aspects and embodiments of the subject disclosure.

FIGS. 6-8 illustrates a process in connection with the aforementioned systems. The process in FIGS. 6-8 can be implemented for example by the systems in FIGS. 1-5 respectively. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Turning now to FIG. 6, illustrated is an example method 600 for adjusting the size of an information block in accordance with various aspects and embodiments of the subject disclosure.

Method 600 can start at 602 where the method includes receiving an information block that comprises a first number of bits. At 604 the method includes determining that the information block is less than a second number of bits, wherein the second number of bits is associated with a forward error correction code. At 606, the method includes padding the information block with a group of null bits resulting in a padded information block, wherein a number of bits in the group of null bits is a difference between the second number and the first number. At 608, the method includes transmitting the padded information block.

Turning now to FIG. 7, illustrated is an example method 700 for segmenting and padding an information block in accordance with various aspects and embodiments of the subject disclosure.

Method 700 can start at 702 where the method includes receiving, by a device comprising a processor, an information block. At 704 the method includes segmenting the information block into a first segment and a second segment, wherein the first segment comprises a first number of bits and the second segment comprises a second number of bits, wherein the first number of bits is above a predetermined bit number associated with an efficiency of a forward error correction code, and the second number of bits is below the predetermined bit number. At 706, the method includes adding a group of null bits to the second segment resulting in an augmented segment, wherein a third number of bits in the augmented segment is at least equal to the predetermined bit number.

Turning now to FIG. 8, illustrated is an example method 800 for segmenting an information block in accordance with various aspects and embodiments of the subject disclosure.

Method 800 can start at 802 where the method includes receiving an information block that is larger than a predetermined size, wherein the predetermined size is associated with an efficiency value determined for a forward error correction code. At 804 the method includes segmenting the information block into at least a first segment and a second segment, wherein the first segment and the second segment are smaller than the predetermined size. At 806, the method includes encoding the first segment and the second segment based on the forward error correction code resulting in an encoded first segment and an encoded second segment.

Figure 9:
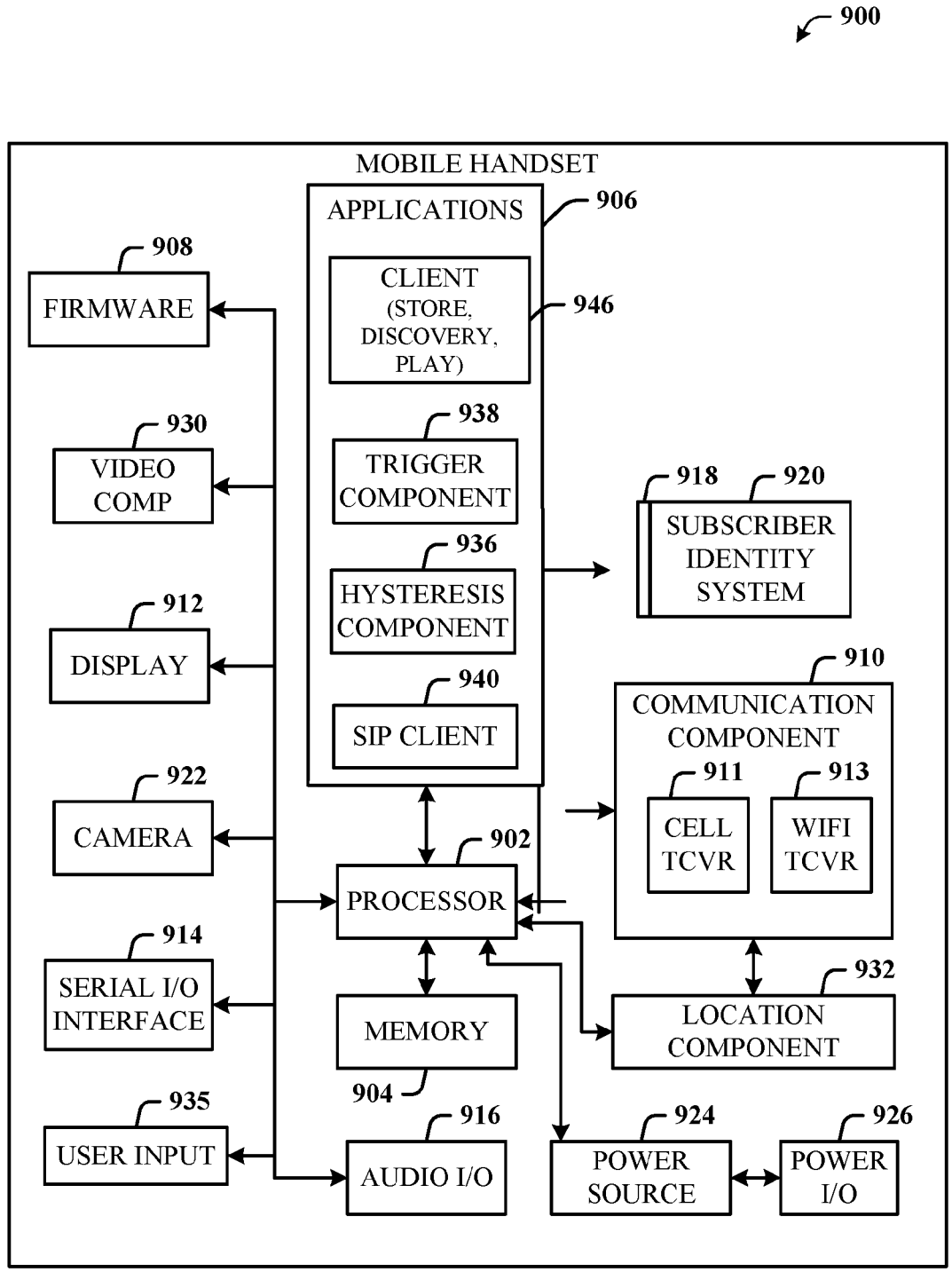
FIG. 9 illustrates an example block diagram of an example user equipment that can be a mobile handset operable to adjust an information block size in accordance with various aspects and embodiments of the subject disclosure.

Referring now to FIG. 9, illustrated is a schematic block diagram of an example end-user device such as a user equipment (e.g., transmitter device 502) that can be a mobile device 900 capable of connecting to a network in accordance with some embodiments described herein. Although a mobile handset 900 is illustrated herein, it will be understood that other devices can be a mobile device, and that the mobile handset 900 is merely illustrated to provide context for the embodiments of the various embodiments described herein. The following discussion is intended to provide a brief, general description of an example of a suitable environment 900 in which the various embodiments can be implemented. While the description includes a general context of computer-executable instructions embodied on a machine-readable storage medium, those skilled in the art will recognize that the innovation also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The handset 900 includes a processor 902 for controlling and processing all onboard operations and functions. A memory 904 interfaces to the processor 902 for storage of data and one or more applications 906 (e.g., a video player software, user feedback component software, etc.). Other applications can include voice recognition of predetermined voice commands that facilitate initiation of the user feedback signals. The applications 906 can be stored in the memory 904 and/or in a firmware 908, and executed by the processor 902 from either or both the memory 904 or/and the firmware 908. The firmware 908 can also store startup code for execution in initializing the handset 900. A communications component 910 interfaces to the processor 902 to facilitate wired/wireless communication with external systems, e.g., cellular networks, VoIP networks, and so on. Here, the communications component 910 can also include a suitable cellular transceiver 911 (e.g., a GSM transceiver) and/or an unlicensed transceiver 913 (e.g., Wi-Fi, WiMax) for corresponding signal communications. The handset 900 can be a device such as a cellular telephone, a PDA with mobile communications capabilities, and messaging-centric devices. The communications component 910 also facilitates communications reception from terrestrial radio networks (e.g., broadcast), digital satellite radio networks, and Internet-based radio services networks.

The handset 900 includes a display 912 for displaying text, images, video, telephony functions (e.g., a Caller ID function), setup functions, and for user input. For example, the display 912 can also be referred to as a "screen" that can accommodate the presentation of multimedia content (e.g., music metadata, messages, wallpaper, graphics, etc.). The display 912 can also display videos and can facilitate the generation, editing and sharing of video quotes. A serial I/O interface 914 is provided in communication with the processor 902 to facilitate wired and/or wireless serial communications (e.g., USB, and/or IEEE 1394) through a hardwire connection, and other serial input devices (e.g., a keyboard, keypad, and mouse). This supports updating and troubleshooting the handset 900, for example. Audio capabilities are provided with an audio I/O component 916, which can include a speaker for the output of audio signals related to, for example, indication that the user pressed the proper key or key combination to initiate the user feedback signal. The audio I/O component 916 also facilitates the input of audio signals through a microphone to record data and/or telephony voice data, and for inputting voice signals for telephone conversations.

The handset 900 can include a slot interface 918 for accommodating a SIC (Subscriber Identity Component) in the form factor of a card Subscriber Identity Module (SIM) or universal SIM 920, and interfacing the SIM card 920 with the processor 902. However, it is to be appreciated that the SIM card 920 can be manufactured into the handset 900, and updated by downloading data and software.

The handset 900 can process IP data traffic through the communication component 910 to accommodate IP traffic from an IP network such as, for example, the Internet, a corporate intranet, a home network, a person area network, etc., through an ISP or broadband cable provider. Thus, VoIP traffic can be utilized by the handset 800 and IP-based multimedia content can be received in either an encoded or decoded format.

A video processing component 922 (e.g., a camera) can be provided for decoding encoded multimedia content. The video processing component 922 can aid in facilitating the generation, editing and sharing of video quotes. The handset 900 also includes a power source 924 in the form of batteries and/or an AC power subsystem, which power source 924 can interface to an external power system or charging equipment (not shown) by a power I/O component 926.

The handset 900 can also include a video component 930 for processing video content received and, for recording and transmitting video content. For example, the video component 930 can facilitate the generation, editing and sharing of video quotes. A location tracking component 932 facilitates geographically locating the handset 900. As described hereinabove, this can occur when the user initiates the feedback signal automatically or manually. A user input component 934 facilitates the user initiating the quality feedback signal. The user input component 934 can also facilitate the generation, editing and sharing of video quotes. The user input component 934 can include such conventional input device technologies such as a keypad, keyboard, mouse, stylus pen, and/or touch screen, for example.

Referring again to the applications 906, a hysteresis component 936 facilitates the analysis and processing of hysteresis data, which is utilized to determine when to associate with the access point. A software trigger component 938 can be provided that facilitates triggering of the hysteresis component 938 when the Wi-Fi transceiver 913 detects the beacon of the access point. A SIP client 940 enables the handset 900 to support SIP protocols and register the subscriber with the SIP registrar server. The applications 906 can also include a client 942 that provides at least the capability of discovery, play and store of multimedia content, for example, music.

The handset 900 can include an indoor network radio transceiver 913 (e.g., Wi-Fi transceiver). This function supports the indoor radio link, such as IEEE 802.11, for the dual-mode GSM handset 900. The handset 900 can accommodate at least satellite radio services through a handset that can combine wireless voice and digital radio chipsets into a single handheld device.

Figure 10:
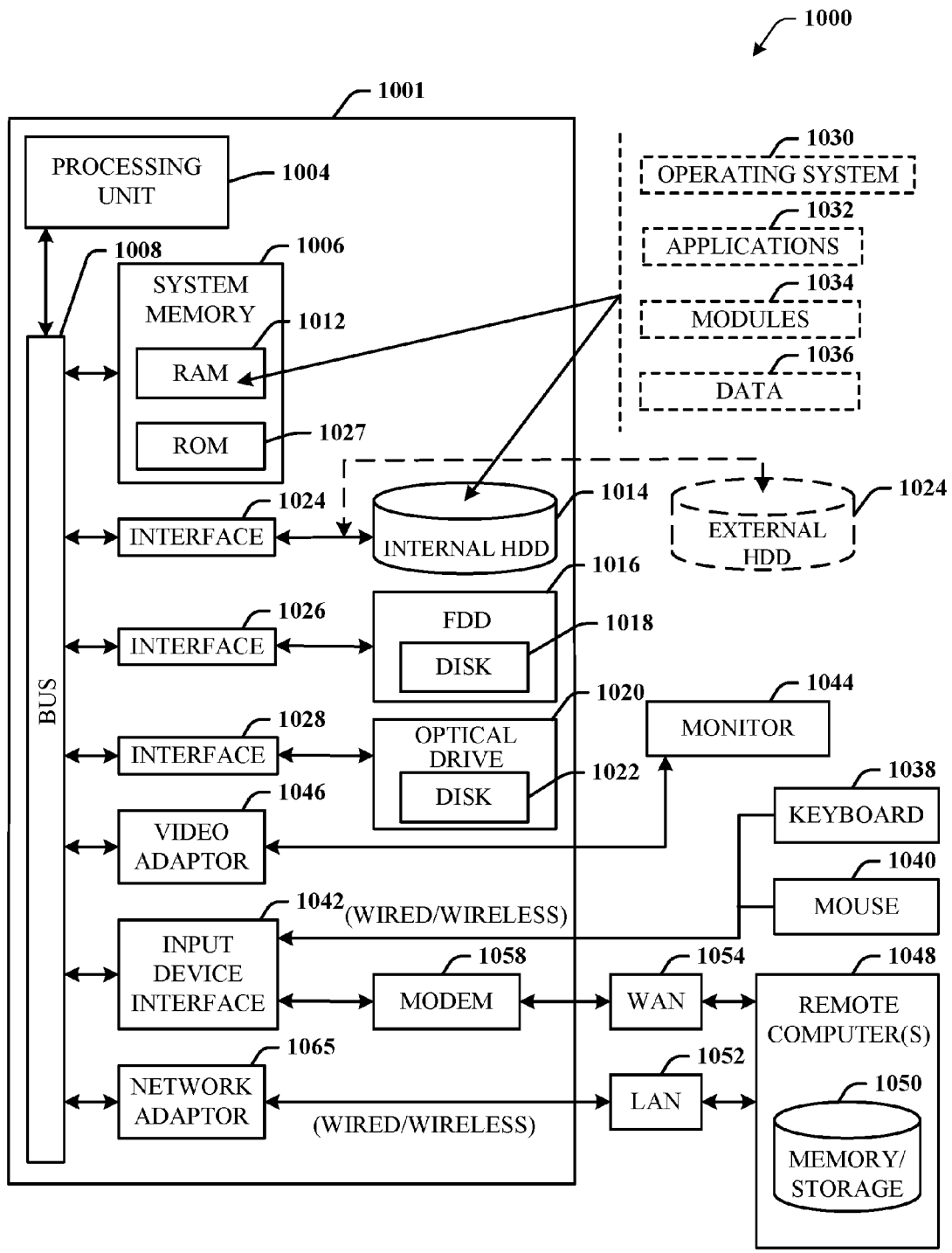
FIG. 10 illustrates an example block diagram of a computer that can be operable to execute processes and methods in accordance with various aspects and embodiments of the subject disclosure.

Referring now to FIG. 10, there is illustrated a block diagram of a computer 1000 operable to execute the functions and operations performed in the described example embodiments. For example, a network node (e.g., network node 306) may contain components as described in FIG. 10. The computer 1000 can provide networking and communication capabilities between a wired or wireless communication network and a server and/or communication device. In order to provide additional context for various aspects thereof, FIG. 10 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 10, implementing various aspects described herein with regards to the end-user device can include a computer 1000, the computer 1000 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1027 and random access memory (RAM) 1012. A basic input/output system (BIOS) is stored in a non-volatile memory 1027 such as ROM, EPROM, EEPROM, which BIOS contains the basic routines that help to transfer information between elements within the computer 1000, such as during start-up. The RAM 1012 can also include a high-speed RAM such as static RAM for caching data.

The computer 1000 further includes an internal hard disk drive (HDD) 1014 (e.g., EIDE, SATA), which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1294 interface technologies. Other external drive connection technologies are within contemplation of the subject innovation.

The drives and their associated computer-readable media provide nonvolatile storage of data, data structures, computer-executable instructions, and so forth. For the computer 1000 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1000, such as zip drives, magnetic cassettes, flash memory cards, cartridges, and the like, can also be used in the example operating environment, and further, that any such media can contain computer-executable instructions for performing the methods of the disclosed innovation.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is to be appreciated that the innovation can be implemented with various commercially available operating systems or combinations of operating systems.

A user can enter commands and information into the computer 1000 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 2394 serial port, a game port, a USB port, an IR interface, etc.

A monitor 1044 or other type of display device is also connected to the system bus 1008 through an interface, such as a video adapter 1046. In addition to the monitor 1044, a computer 1000 typically includes other peripheral output devices (not shown), such as speakers, printers, etc.

The computer 1000 can operate in a networked environment using logical connections by wired and/or wireless communications to one or more remote computers, such as a remote computer(s) 1048. The remote computer(s) 1048 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1000 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1000 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 through the input device interface 1042. In a networked environment, program modules depicted relative to the computer, or portions thereof, can be stored in the remote memory/storage device 1050. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated example aspects of the embodiments. In this regard, it will also be recognized that the embodiments comprises a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media Further, terms like "user equipment," "user device," "mobile device," "mobile," "station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

The above descriptions of various embodiments of the subject disclosure and corresponding figures and what is described in the Abstract, are described herein for illustrative purposes, and are not intended to be exhaustive or to limit the disclosed embodiments to the precise forms disclosed. It is to be understood that one of ordinary skill in the art may recognize that other embodiments having modifications, permutations, combinations, and additions can be implemented for performing the same, similar, alternative, or substitute functions of the disclosed subject matter, and are therefore considered within the scope of this disclosure. Therefore, the disclosed subject matter should not be limited to any single embodiment described herein, but rather should be construed in breadth and scope in accordance with the claims below.

What is claimed is:

1. A transmitter, comprising:
   a processor; and
   a memory that stores executable instructions that, when executed by the processor, facilitate performance of operations, comprising:
      receiving an information block that comprises a first number of bits;
      determining that the information block is less than a second number of bits, wherein the second number of bits is associated with a code rate of a forward error correction code, wherein the code rate of the forward error correction code is less than the second number by a predetermined amount;
      padding the information block with a group of bits resulting in a padded information block, wherein a number of bits in the group of bits is a difference between the second number and the first number; and
      transmitting the padded information block.

2. The transmitter of claim 1, wherein the transmitting further comprises transmitting the padded information block to a mobile device.

3. The transmitter of claim 2, wherein the operations further comprise:
   transmitting a control signal indicating the number of bits in the group of bits.

4. The transmitter of claim 3, wherein the control signal comprises a message authentication code header of the information block.

5. The transmitter of claim 1, wherein the operations further comprise:
   encoding the padded information block based on the forward error correction code.

6. The transmitter of claim 1, wherein the information block is an information block segment.

7. The transmitter of claim 1, wherein the operations further comprise:
   determining that the code rate of the forward error correction code has changed.

8. The transmitter of claim 7, wherein the operations further comprise:
   in response to the determining that the code rate of the forward error correction code has changed, padding the information block with a different number of bits.

9. The transmitter of claim 7, wherein the determining that the code rate of the forward error correction code has changed is based on control information received from the receiver.

10. The transmitter of claim 1, wherein the group of bits is a group of null bits.

11. The transmitter of claim 1, wherein the group of bits is a group of non-null bits.

12. A method, comprising:
   receiving, by a transmitter device comprising a processor, an information block that comprises a first number of bits;

determining, by the transmitter device, that the first number of bits of the information block is less than a second number of bits associated with a code rate of a forward error correction code, wherein the code rate of the forward error correction code is set less than the second number of bits by a defined number of bits;

padding, by the transmitter device, the information block with a group of bits resulting in a padded information block, wherein a third number of bits in the group of bits of the padded information block is a difference between the second number and the first number; and transmitting, by the transmitter device, the padded information block.

13. The method of claim 12, wherein the transmitting further comprises transmitting the padded information block to a user equipment device.

14. The method of claim 13, transmitting a control signal indicating the third number of bits in the group of bits.

15. The method of claim 14, wherein the control signal comprises a message authentication code header of the information block.

16. The method of claim 12, further comprising:
encoding, by the transmitter device, the padded information block based on the forward error correction code.

17. A non-transitory machine-readable storage medium, comprising executable instructions that, when executed by a processor, facilitate performance of operations, comprising:

receiving an information block that comprises a first number of bits;

determining that the information block comprises less than a second number of bits associated with a code rate of a forward error correction code, wherein the code rate of the forward error correction code is less than the second number of bits by a predefined number of bits;

padding the information block with a group of bits resulting in a padded information block, wherein a third number of bits in the group of bits is a difference between the second number and the first number; and transmitting the padded information block.

18. The non-transitory machine-readable storage medium of claim 17, wherein the operations further comprise:
determining that the code rate of the forward error correction code has changed.

19. The non-transitory machine-readable storage medium of claim 18, wherein the operations further comprise:
in response to the determining that the code rate of the forward error correction code has changed, padding the information block with a different number of bits.

20. The non-transitory machine-readable storage medium of claim 18, wherein the determining that the code rate of the forward error correction code has changed is based on control information received from the receiver.

* * * * *